United States Patent
Chen et al.

(10) Patent No.: US 12,341,010 B2
(45) Date of Patent: Jun. 24, 2025

(54) PREPARATION METHOD FOR SEMICONDUCTOR STRUCTURE AND SAME

(71) Applicant: CHANGXIN MEMORY TECHNOLOGIES, INC., Hefei (CN)

(72) Inventors: Longyang Chen, Hefei (CN); Shijie Bai, Hefei (CN); Zhongming Liu, Hefei (CN); Yexiao Yu, Hefei (CN); Xianguo Zhou, Hefei (CN); Bin Zhao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 517 days.

(21) Appl. No.: 17/743,560

(22) Filed: May 13, 2022

(65) Prior Publication Data

US 2023/0282479 A1    Sep. 7, 2023

Related U.S. Application Data

(63) Continuation of application No. PCT/CN2022/080318, filed on Mar. 11, 2022.

(30) Foreign Application Priority Data

Mar. 4, 2022    (CN) .......................... 202210209445.5

(51) Int. Cl.
*H01L 21/033*    (2006.01)
*H01L 21/027*    (2006.01)
(Continued)

(52) U.S. Cl.
CPC ...... *H01L 21/0337* (2013.01); *H01L 21/0276* (2013.01); *H01L 21/0332* (2013.01);
(Continued)

(58) Field of Classification Search
CPC ........... H01L 21/0337; H01L 21/32139; H01L 21/0334; H01L 21/308–3088;
(Continued)

(56) References Cited

U.S. PATENT DOCUMENTS 6,429,123 B1    8/2002  Tseng
6,599,667 B2    7/2003  Yusa
(Continued)

FOREIGN PATENT DOCUMENTS

CN    106252229 A    12/2016
CN    111584431 A    8/2020
(Continued)

OTHER PUBLICATIONS

B. Halg, "On a nonvolatile memory cell based on micro-electromechanics," IEEE Proceedings on Micro Electro Mechanical Systems, An Investigation of Micro Structures, Sensors, Actuators, Machines and Robots., Napa Valley, CA, USA, (Year: 1990).*
(Continued)

*Primary Examiner* — Dale E Page
*Assistant Examiner* — Douglas Yap
(74) *Attorney, Agent, or Firm* — Kilpatrick Townsend & Stockton LLP

(57) ABSTRACT

A preparation method for a semiconductor structure and a semiconductor structure are provided. Herein, the preparation method comprises: providing a structure to be processed, wherein the structure to be processed comprises a substrate, and an etching target layer, a bottom mask layer and a first mask layer stacked on the substrate; patterning the first mask layer to form a first pattern, the first pattern exposing parts of the bottom mask layer; forming spacers with vertical sidewall morphology on sidewalls of the first mask layer; removing the first mask layer; filling a gap between the spacers with a filling layer, in which a material
(Continued)

of the spacers to a material of the filling layer has a high etching selectivity ratio; and removing the spacers.

17 Claims, 16 Drawing Sheets

(51) Int. Cl.
    *H01L 21/311* (2006.01)
    *H01L 21/3213* (2006.01)
    *H10B 12/00* (2023.01)
(52) U.S. Cl.
    CPC ... *H01L 21/31116* (2013.01); *H01L 21/31122* (2013.01); *H01L 21/32135* (2013.01); *H01L 21/32139* (2013.01); *H10B 12/01* (2023.02)
(58) Field of Classification Search
    CPC ..... H01L 21/0273–0279; H01L 21/312–3128; H01L 21/7681; H01L 21/76811; H01L 21/76813; H01L 21/467; H01L 21/475; H01L 21/0332–0338; H01L 21/311–31144; H10B 12/01–09
    See application file for complete search history.

(56) References Cited

U.S. PATENT DOCUMENTS

| | | | |
|---|---|---|---|
| 7,291,560 B2 | 11/2007 | Parascandola | |
| 8,546,258 B2 | 10/2013 | Kim | |
| 9,911,619 B1 | 3/2018 | Xie | |
| 10,157,751 B1 | 12/2018 | Chang | |
| 10,181,401 B1* | 1/2019 | Shih | H10D 84/038 |
| 10,991,584 B2 | 4/2021 | Xu | |
| 2005/0106887 A1* | 5/2005 | Chen | H01L 21/76816 |
| | | | 257/E21.577 |
| 2006/0166482 A1* | 7/2006 | Kanamura | H01L 21/76813 |
| | | | 438/736 |
| 2006/0199370 A1* | 9/2006 | Dai | H01L 21/76808 |
| | | | 257/E21.256 |
| 2007/0026684 A1 | 2/2007 | Parascandola | |
| 2008/0009138 A1* | 1/2008 | Lee | H01L 21/31144 |
| | | | 257/E21.038 |
| 2013/0171821 A1 | 7/2013 | Kim | |
| 2013/0216776 A1* | 8/2013 | Arnold | H01L 21/0332 |
| | | | 430/323 |
| 2015/0035081 A1 | 2/2015 | Cheng et al. | |
| 2015/0056724 A1 | 2/2015 | Shieh et al. | |
| 2015/0064907 A1 | 3/2015 | Sel | |
| 2016/0300728 A1* | 10/2016 | Mikami | H01C 17/003 |
| 2019/0139777 A1 | 5/2019 | Chang | |
| 2019/0189446 A1 | 6/2019 | Xu et al. | |
| 2019/0348287 A1* | 11/2019 | Varghese | H01L 21/32155 |
| 2021/0125836 A1* | 4/2021 | Huang | H01L 21/76816 |
| 2021/0366713 A1 | 11/2021 | Fulford | |
| 2021/0366714 A1* | 11/2021 | Fulford | H01L 21/0338 |

FOREIGN PATENT DOCUMENTS

| | | | | |
|---|---|---|---|---|
| JP | 2013526061 A | 6/2013 | | |
| TW | I608292 B | 12/2017 | | |
| TW | I698929 B | 7/2020 | | |
| TW | I724815 B | 4/2021 | | |
| TW | 202135138 A | 9/2021 | | |
| WO | 2020102164 A1 | 5/2020 | | |
| WO | WO-2021088670 A1 * | 5/2021 | ........ | H01L 21/31116 |
| WO | 2021221025 A1 | 11/2021 | | |

OTHER PUBLICATIONS

English Translation of WO-2021088670-A1 (Year: 2021).*
Japanese Patent Office, First Office Action Issued in Application No. 2022-548078, Mar. 19, 2024, 4 pages.
Supplementary European Search Report in the European application No. 22728335.5, mailed on Oct. 13, 2023, 8 pages.
First Office Action of the Taiwanese application No. 111121592, issued on Apr. 6, 2023, 4 pages with English abstract.
International Search Report in the international application No. PCT/CN2022/080318, mailed on Aug. 26, 2022, 2 pages.

* cited by examiner

PREPARATION METHOD FOR SEMICONDUCTOR STRUCTURE AND SAME

CROSS-REFERENCE OF RELATED APPLICATIONS

This application is a continuation application of International Application No. PCT/CN2022/080318, filed on Mar. 11, 2022, which claims priority to Chinese Patent Application No. 202210209445.5, filed on Mar. 4, 2022. The disclosures of International Application No. PCT/CN2022/080318 and Chinese Patent Application No. 202210209445.5 are hereby incorporated by reference in their entireties.

BACKGROUND

With the evolution of semiconductor technology nodes and machines, the density of devices in integrated circuits becomes increasingly high, and the feature critical dimensions (CD) of semiconductor devices are decreasing, which has approached the optical physical limit of lithography. The mask patterns formed by existing lithography processes are difficult to meet the requirements of continuously decreasing feature critical dimensions of semiconductor devices, which limits the development of semiconductor technology. How to optimize the preparation process of fine patterns has become an urgent problem to be solved.

SUMMARY

The disclosure relates to, but not limited to, the technical field of semiconductor, in particular to a preparation method for a semiconductor structure and a semiconductor structure.

Embodiments of the present disclosure provide a preparation method for a semiconductor structure. The method comprises: providing a structure to be processed, in which the structure to be processed comprises a substrate, and an etching target layer, a bottom mask layer and a first mask layer stacked on the substrate; patterning the first mask layer to form a first pattern, the first pattern exposing parts of the bottom mask layer; forming spacers with vertical sidewall morphology on sidewalls of the first mask layer; removing the first mask layer; filling a gap between the spacers with a filling layer, in which there is a high etching selectivity ratio of a material of the spacers to a material of the filling layer; and removing the spacers.

Embodiments of the present disclosure also provide a semiconductor structure prepared by anyone of the above methods.

BRIEF DESCRIPTION OF THE DRAWINGS

In order to more clearly illustrate the embodiments of the disclosure or the technical solution in the conventional technique, a brief description of the drawings required to be used in the embodiments will be provided below. Apparently, the drawings of the following description are merely some embodiments of the disclosure. For a person of ordinary skill in the art, other drawings can be obtained based on these drawings without creative work.

DETAILED DESCRIPTION

Figure 1:
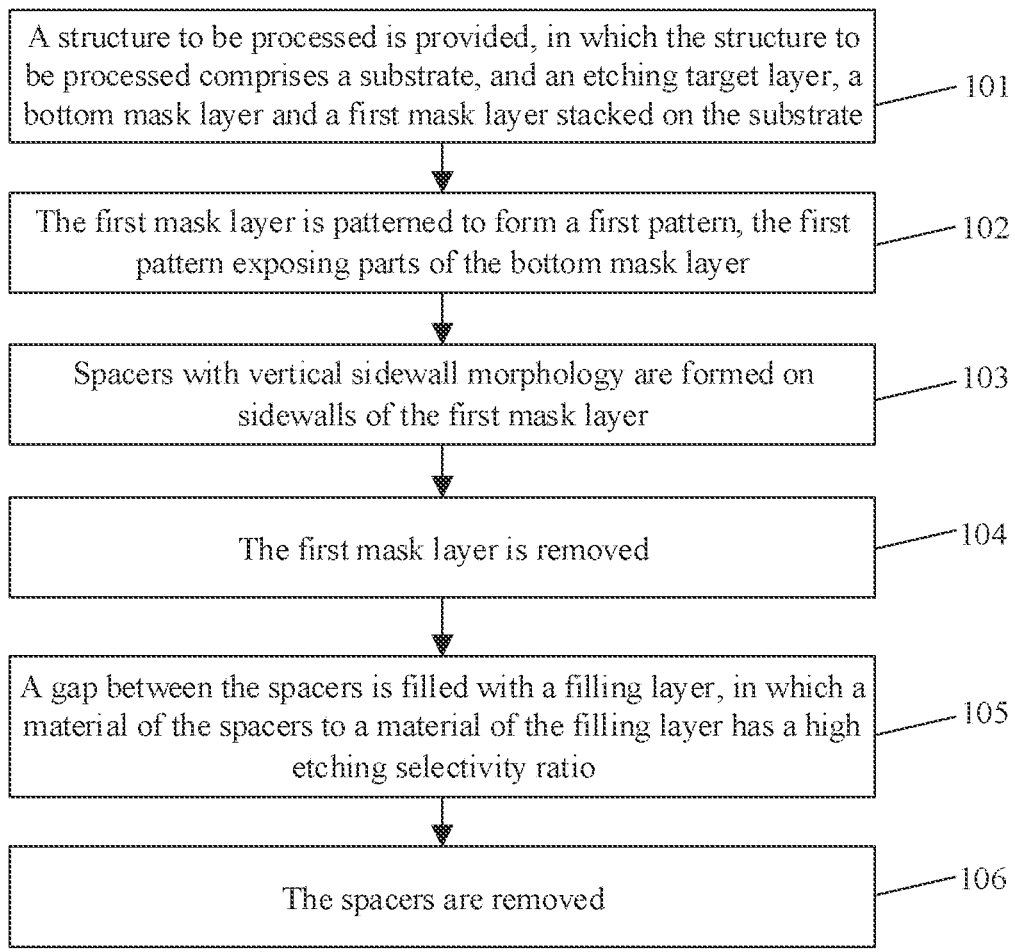
FIG. 1 illustrates a flow chart of a preparation method for a semiconductor structure in an embodiment of the present disclosure.

Exemplary embodiments of the present disclosure will be described in more detail below with reference to the accompanying drawings. Although exemplary embodiments of the present disclosure are shown in the drawings, it should be understood that the present disclosure may be embodied in various forms and should be not be limited to the specific embodiments set forth herein. These embodiments are provided so that the disclosure will be more thoroughly understood and the scope of the disclosure will be fully conveyed to those skilled in the art.

In the description herein below, numerous specific details are given to provide a more thorough understanding of the disclosure. However it will be apparent to those skilled in the art that the present disclosure may be embodied without one or more of these details. In other examples, some technical features well known in the art are not described in order to avoid confusion with the present disclosure; that is, not all of the features of the actual embodiment are described herein and well-known functions and structures are not described in detail.

In the drawings, the dimensions of layers, regions, elements and their relative dimensions may be exaggerated for clarity. Throughout the description, the same reference numeral denotes the same element.

It should be understood that when an element or layer is referred to as "on", "adjacent to", "connected to" or "coupled to" another element or layer, it may be directly on the another element or layer, adjacent to the another element or layer, or connected to or coupled to the another element or layer, or there may be an intermediate element or layer. In contrast, when an element is referred to as "directly on", "directly adjacent to", "directly connected to" or "directly coupled to" another element or layer, there is no intermediate element or layer. It should be understood that although the terms, "first", "second", "third" and the like may be used to describe various elements, components, regions, layers, and/or portions, these elements, components, regions, layers, and/or portions should not be limited by these terms. These terms are only used to distinguish one element, component, region, layer or portion from another element, component, region, layer or portion. Therefore, without departing from the teaching of the present disclosure, a first element, component, region, layer or portion discussed hereinafter may be expressed as a second element, component, region, layer or portion. While discussing a second element, component, region, layer or portion, it does not imply that a first element, component, region, layer or portion is necessarily present in the present disclosure.

The terms used herein are intended to describe specific embodiments only and are not to be a limitation to the present disclosure. As used herein, the singular forms "a/an", "one", and "the" may include the plural forms as well, unless the context clearly dictates otherwise. It should be further understood that when terms "comprise" and/or "include" are used in the specification, it means that the stated features, integers, steps, operations, elements and/or components are present, but the presence or addition of one or more of other features, integers, steps, operations, elements, components and/or combinations is not excluded. When used herein, the term "and/or" includes any of the listed items and all combinations thereof.

Patterning process in related art is prone to problems such as bridge, breakage, poor filling quality in corner space, etc., and it is often difficult to form a fine patterned structure.

On the basis of this, embodiments of the present disclosure provide a preparation method for a semiconductor structure. With reference to FIG. 1, the preparation method comprises the following operations.

The operation 101: A structure to be processed is provided, in which the structure to be processed comprises a substrate, an etching target layer, a bottom mask layer and a first mask layer stacked on the substrate.

The operation 102: The first mask layer is patterned to form a first pattern, in which the first pattern exposes parts of the bottom mask layer.

The operation 103: Spacers with vertical sidewall morphology are formed on sidewalls of the first mask layer.

The operation 104: The first mask layer is removed.

The operation 105: A gap between the spacers is filled with a filling layer, in which a material of the spacers to a material of the filling layer has a high etching selectivity ratio.

The operation 105: The spacers are removed.

The embodiments of the present disclosure adopt a method of forming spacers with vertical sidewall morphology firstly, then depositing a filling layer and removing the spacers to form a recess, to form a mask corresponding to a pattern. The high etching selectivity ratio of the spacers to the filling layer can improve the consistency of pattern transfer and the fineness of forming a patterned structure.

Specific embodiments of the present disclosure will be described in detail below with reference to FIGS. 2A to 2N. In detailing the embodiments of the present disclosure, the schematic diagram is partially enlarged without a general scale for convenience in description, and the schematic diagram is only taken as an example, which should not limit the scope of protection of the disclosure herein.

Figure 2A:
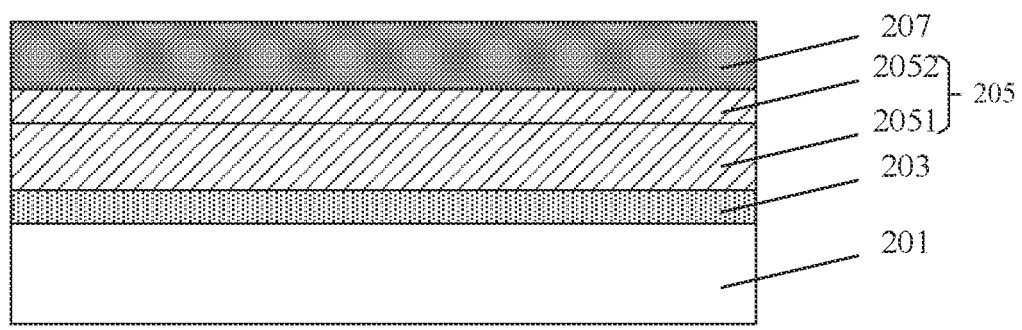
FIGS. 2A to 2N illustrate a device structural diagram of a semiconductor structure provided by embodiments of the present disclosure in the preparing process.

The method begins with the operation 101, as shown in FIG. 2A, a structure to be processed is provided, in which the structure to be processed includes a substrate 201, and an etching target layer 203, a bottom mask layer 205 and a first mask layer 207 stacked on the substrate.

Here, the substrate may be a semiconductor substrate and may include at least one elemental semiconductor material (e.g. silicon (Si) substrate, germanium (Ge) substrate), at least one III-V compound semiconductor material, at least one II-VI compound semiconductor material, at least one organic semiconductor material, or other semiconductor materials known in the art. In a specific embodiment, the substrate is a silicon substrate, which may be doped or undoped. Specifically, the substrate may be, but is not limited to, a wafer.

Taking as an example, the etching target layer 203 may be a material layer to be etched, which is located on a substrate, for instance, including but not limited to a polysilicon layer or a metal layer, and in some embodiments may also be a substrate; that is, the target layer to be etched later may be a polysilicon layer located on the base, also may be a metal layer located on the substrate or may be the substrate itself. In some embodiments, the etching target layer 203 may be tungsten (W).

In some embodiments, with reference to FIG. 2A, the bottom mask layer 205 comprises a first bottom mask layer 2051 and a second bottom mask layer 2052, and the second bottom mask layer 2052 is located above the first bottom mask layer 2051. Herein, the bottom mask layer 205 not only participates in pattern transfer, but also serves as an etching barrier layer to protect the etching target layer and avoid the etching target layer from being damaged by the subsequent process of forming a filling layer mask. The mask layer with multi-layer structure can improve the line width consistency and reduce edge roughness. Here, the material of the first bottom mask layer 2051 may include, but is not limited to, an amorphous carbon layer (ACL), and the material of the second bottom mask layer 2052 may include, but is not limited to, silicon nitride (SiN) or silicon oxynitride (SiON). More specifically, the material of the second bottom mask layer may be silicon-rich silicon oxynitride. In practice, the process for forming the bottom mask layer 205 includes, but is not limited to, chemical vapor deposition (CVD), plasma enhanced chemical vapor deposition (PECVD), atomic layer deposition (ALD), or a combination thereof.

Here, the first mask layer 207 may include but is not limited to an amorphous carbon layer (ACL). In practice, the forming process of the first mask layer 207 includes, but is not limited to, chemical vapor deposition (CVD), plasma enhanced chemical vapor deposition (PECVD), atomic layer deposition (ALD), or a combination thereof.

Figure 2B:
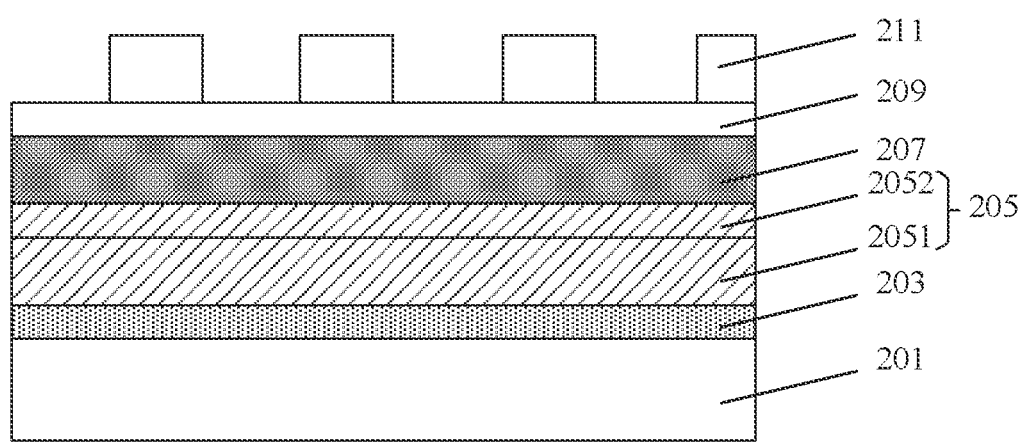
Figure 2C:
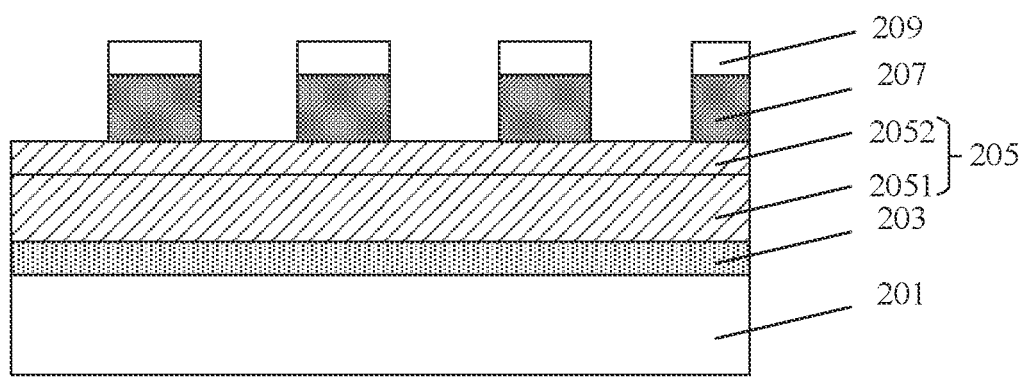
Figure 2D:
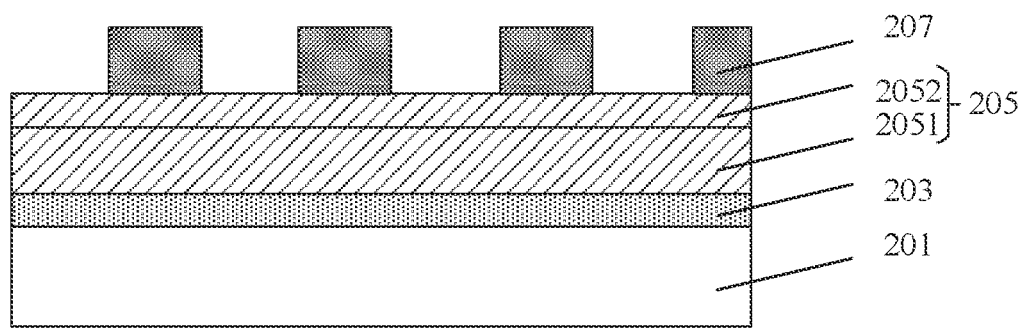

Subsequently, as shown in FIGS. 2B to 2D, the operation 102 is performed, that is, the first mask layer 207 is patterned to form a first pattern, in which the first pattern exposes parts of the bottom mask layer 205.

In some embodiments, as shown in FIGS. 2B to 2D, patterning the first mask layer 207 comprises: depositing a third mask layer 209 on the first mask layer 207; patterning the third mask layer 209 and the first mask layer 207; removing the third mask layer 209 and retaining the first mask layer 207. In this way, after the cap layer structure at the top is removed and then the spacer layer with high modulus is deposited, the symmetrical spacer can be formed by one-step etching.

Specifically, firstly, referring to FIG. 2B, the third mask layer 209 is deposited on the first mask layer 207. Here, the material of the third mask layer may include, but is not limited to, an oxide or silicon oxynitride (SiON), such as, for example, silica ($SiO_2$) or oxygen-enriched silicon oxynitride. In practice, the process for forming the third mask layer includes, but is not limited to, chemical vapor deposition (CVD), plasma enhanced chemical vapor deposition (PECVD), atomic layer deposition (ALD), or a combination thereof.

Subsequently, referring to FIG. 2C, the third mask layer 209 and the first mask layer 207 are patterned.

In some embodiments, patterning the third mask layer 209 and the first mask layer 207 comprises: forming a photoresist (PR) layer on the third mask layer 209; patterning the photoresist layer to form a first patterned photoresist layer 211, the first patterned photoresist layer 211 exposing the third mask layer 209; etching the third mask layer 209 and the first mask layer 207 with the first patterned photoresist layer 211 as a mask. For example, a photoresist is spin-coated on the third mask layer 209, and the photoresist is patterned through a mask. The process for patterning the third mask layer 209 and the first mask layer 207 is not limited thereto. In other embodiments, the third mask layer 209 and the first mask layer 207 may also be patterned by self-aligned double patterning (SADP) process or self-aligned quadruple patterning (SAQP) process on the surface of the third mask layer 209.

Finally, referring to FIG. 2D, the third mask layer 209 is removed and the first mask layer 207 is retained. Here, the third mask layer 209 may be removed by dry etching that includes sputtering and ion beam milling, plasma etching, high pressure plasma etching, high density plasma (HDP) etching, reactive ion etching (RIE) and the like.

In some embodiments, the photoresist layer further includes a Si-containing anti-reflection coating (SiARC). The anti-reflection coating covers the surface of the third mask layer 209. In this way, the reflected light of lithography can be absorbed, thereby improving the line width resolution in lithography process.

Figure 2E:
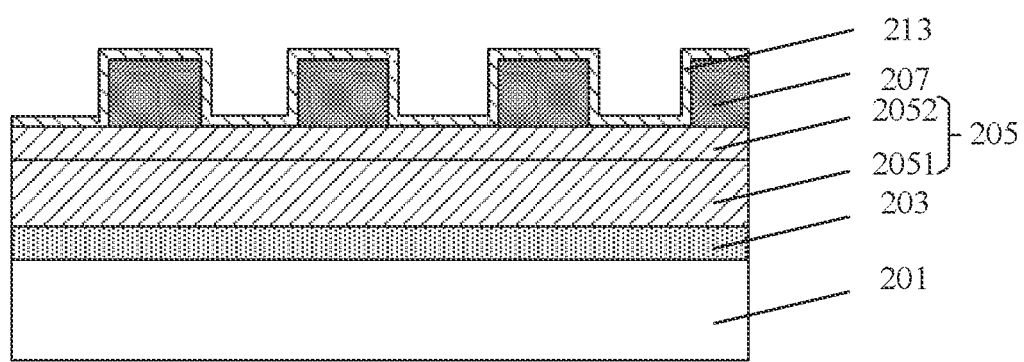
Figure 2F:
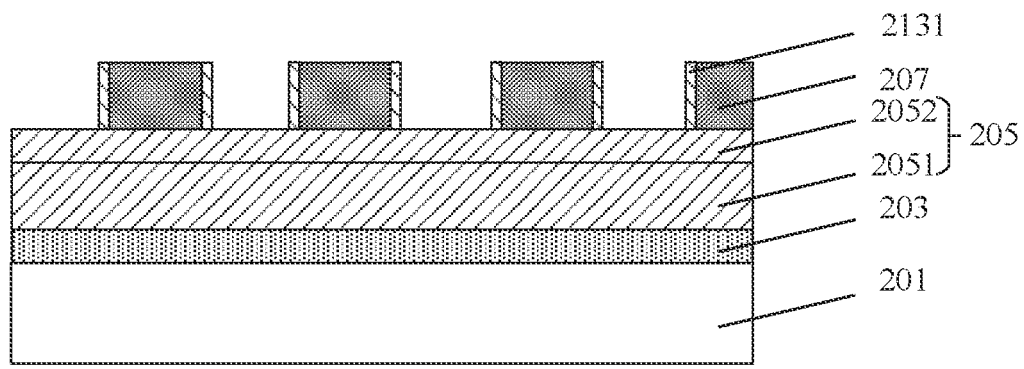

Subsequently, as shown in FIG. 2F, the operation 103 is performed, that is, spacers 2131 with vertical sidewall morphology are formed on sidewalls of the first mask layer 207.

In some embodiments, the material of the spacers 2131 has a Young's modulus greater than or equal to 25 GPa. In practice, Young's modulus of the material of the spacers 2131 can have a range of 25 GPa-250 GPa, exemplary, for example, may be 28 Gpa, 46 Gpa, 190 GPa or 230 GPa. By choosing the spacers with appropriate Young's modulus, after the pattern of the first mask layer is subsequently removed, it is easier to maintain the vertical morphology for the spacers with high Young's modulus; in addition, the higher the Young's modulus, the less easily the spacers are to deform, so that a finer pattern can be obtained and the accuracy can be improved. In some embodiments, the material of the spacers 2131 has a Young's modulus of less than 500 Gpa, so that the spacers and other materials are not prone to delamination caused by stress and have better compatibility.

In some embodiments, the material of the spacers 2131 comprises polysilicon, silicon nitride or metal oxide. In a specific embodiment, the material of the spacers 2131 includes boron-doped polysilicon (Cygnus poly) or titanium oxide. In this way, a higher Young's modulus can be obtained, and the etching selectivity ratio of the material of the spacers to the material of the filling layer material formed subsequently is large, so that the influence on the structure of the filling layer mask is reduced in the subsequent process for removing spacers, and the problem of metal line bridging or breakage is improved.

In some embodiments, as shown in FIGS. 2E to 2F, forming spacers 2131 with vertical sidewall morphology on sidewalls of the first mask layer 207 comprises: forming a spacer layer 213 covering the first mask layer 207 and a surface of the bottom mask layer 205; removing the spacer layer 213 covering a top of the first mask layer 207 and the spacer layer 213 covering the surface of the bottom mask layer 205, and retaining the spacer layer 213 on the sidewalls of the first mask layer 207 to form spacers 2131 with vertical sidewall morphology.

Specifically, firstly, referring to FIG. 2E, the spacer layer 213 covering the first mask layer 207 and a surface of the bottom mask layer 205 is formed. Here, the spacer layer may be formed by chemical vapor deposition process, spin coating process, or atomic layer deposition process, and its thickness may have a range of 30 nm to 180 nm, for example, may be 60 nm, 65 nm, 80 nm, 85 nm, 90 nm, 95 nm, or 120 nm. If the thickness of the spacer layer is smaller, it will not be conducive to the subsequent formation of spacers with vertical sidewall morphology, and the spacers with vertical sidewall morphology will easily collapse. If the thickness of the spacer layer is larger, it will not be conducive to the formation of fine patterns. In practice, when selecting the thickness of the spacer layer, it should take into account the material of the spacers and the Young's modulus of the material of the spacers. For example, if the Young's modulus of the spacer higher, a smaller thickness of the spacer layer may be selected, and thus the fineness of the pattern is improved.

Subsequently, as shown in FIG. 2F, the spacer layer 213 covering the top of the first mask layer 207 and the spacer layer 213 covering the surface of the bottom mask layer 205 is removed, and the spacer layer 213 on the a sidewall of the first mask layer 207 is retained to form spacers 2131 with vertical sidewall morphology.

Figure 2G:
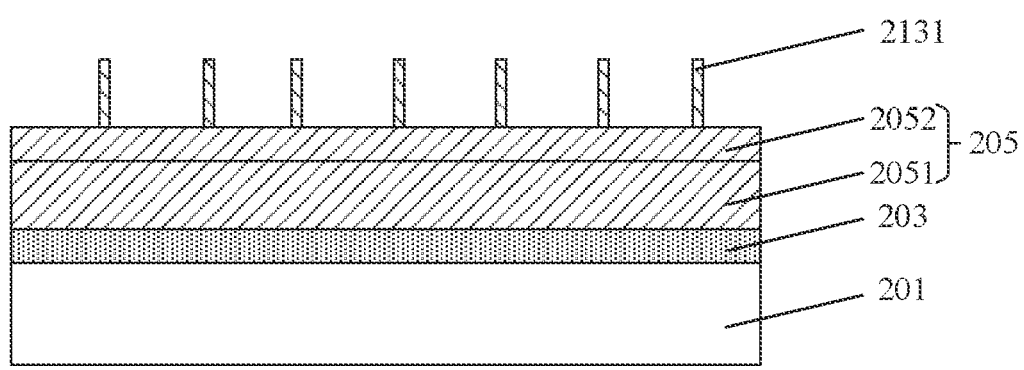

Then, as shown in FIG. 2G, the operation 104 is performed, that is the first mask layer 207 is removed. In practice, the first mask layer 207 may be removed by dry etching process, and the dry etching process includes sputtering and ion beam milling, plasma etching, high pressure plasma etching, high density plasma (HDP) etching, reactive ion etching (RIE) and the like. Dry etching process has high selection ratio, good controllability, flexibility and repeatability, and safe operation of fine lines, which can ensure the high fidelity of fine patterns after transfer.

In some embodiments, removing the first mask layer comprises: removing the first mask layer 207 by an ashing process. The pattern of the first mask layer can be efficiently and completely removed by the ashing process, and no intermediate products will be brought. At the same time, the surface cleanliness of the bottom mask layer can be improved, which is beneficial to the subsequent deposition of the filling layer. In practice, the parameters of the ashing process are as follows. The temperature of the ashing chamber is 235 to 265° C., the radio frequency power is 2000 to 5000 W, and the pressure of the ashing chamber is 50 to 1500 Mtorr, and the ashing time is 5 to 300 seconds. In this way, the efficiency of removing the first mask layer 207 can be further improved, the cleanliness of the surface of the bottom mask layer can be improved, and the yield is increased.

In some embodiments, after the pattern of the first mask layer is removed, smoothing the profile of the spacers is further included such that the profiles of both sides of the spacers are uniformly symmetrically smooth. In this way, the quality of the filling layer mask formed subsequently according to the spacers can be improved, so that the filling layer mask is more regular, thereby improving the yield of the finally formed product. In some embodiments, the profiles of the spacers are smoothed by the gas etching process, in which the etching gas comprises at least one of $Cl_2$, HBr, $O_2$, $SiCl_4$ and SiBr.

Figure 2H:
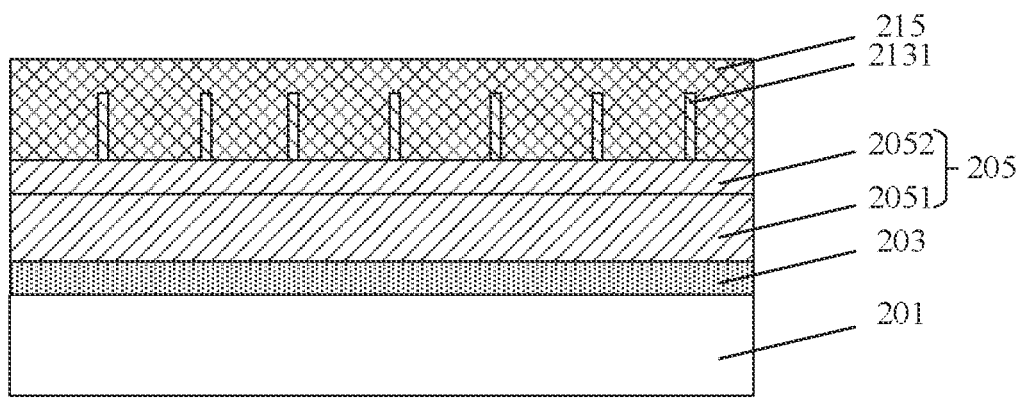
Figure 2I:
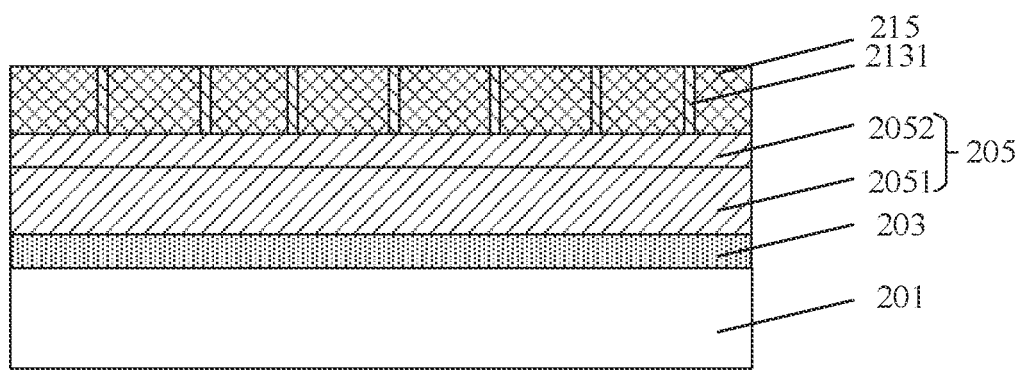

Subsequently, as shown in FIG. 2I, the operation 105 is performed, that is, the gap between the spacers 2131 is filled with a filling layer 215, in which the material of the spacers 2131 to the material of the filling layer 215 has a high etching selectivity ratio.

In some embodiments, as shown in FIG. 2H to 2I, filling the gap between the spacers 2131 with the filling layer 215 comprises: forming the filling layer 215 on the bottom mask layer 205, in which the filling layer fills each gap between two adjacent ones of the spacers 2131 and covers the spacers 2131; and planarizing the filling layer 215 such that an upper surface of the filling layer 215 is flush with upper surfaces of the spacers 2131.

Specifically, firstly, referring to FIG. 2H, the filling layer 215 is formed on the bottom mask layer 205, in which the filling layer fills the gap between two adjacent ones of the spacers 2131 and covers the spacers 2131. In some embodiments, the material of the filling layer comprises oxide. Compared with spin-on-carbon (SOC) layer filled by the related technology, the filling effect of oxide is better, which further solves the problem of poor effect of SOC filling in the prior art. In practice, the filling layer may be formed by chemical vapor deposition, floating Oxide coating or atomic layer deposition.

In some embodiments, the etching selectivity ratio of the material of the spacers to the material of the filling layer is greater than or equal to 100. Exemplary, the etching selectivity ratio of the material of the spacers to the material of the filling layer has, for example, a range of 120-800, and more specifically, may be 155, 334 or 650. In this way, the influence on the filling layer mask structure is reduced in the subsequent process for removing spacers, and the problem of metal line bridging or breakage is improved.

Subsequently, referring to FIG. 2I, the filling layer is planarized such that the upper surface of the filling layer 215 is flush with the upper surfaces of the spacers 2131. In practice, the process of planarization includes chemical mechanical polishing, back etching, or a combination thereof.

Figure 2J:
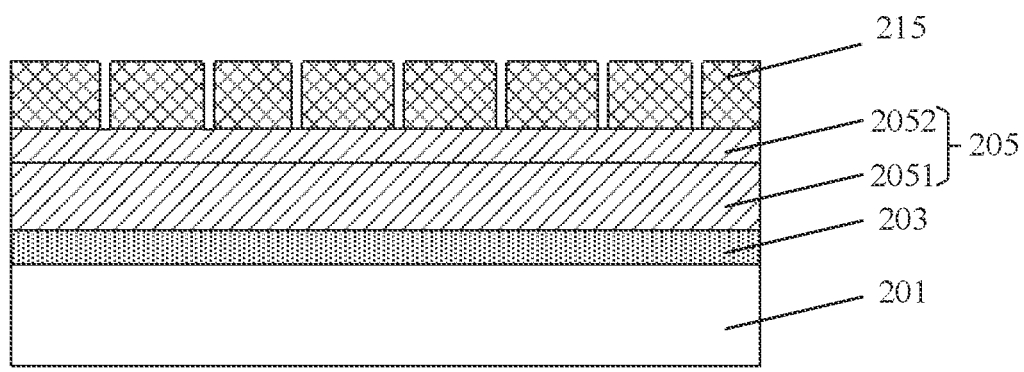

Finally, referring to FIG. 2J, the operation 106 is performed, that is, the spacers 2131 are removed.

In some embodiments, removing the spacers 2131 comprises: removing the spacers 2131 by gas etching, in which the gas comprises chlorine and hydrogen bromide. It should be understood that gas etching has less pollution to the bottom mask, the etching rate is controllable, and the formed filling layer mask is finer. In other embodiments, the gas includes at least one of $O_2$, $SiCl_4$ and SiBr.

Figure 2K:
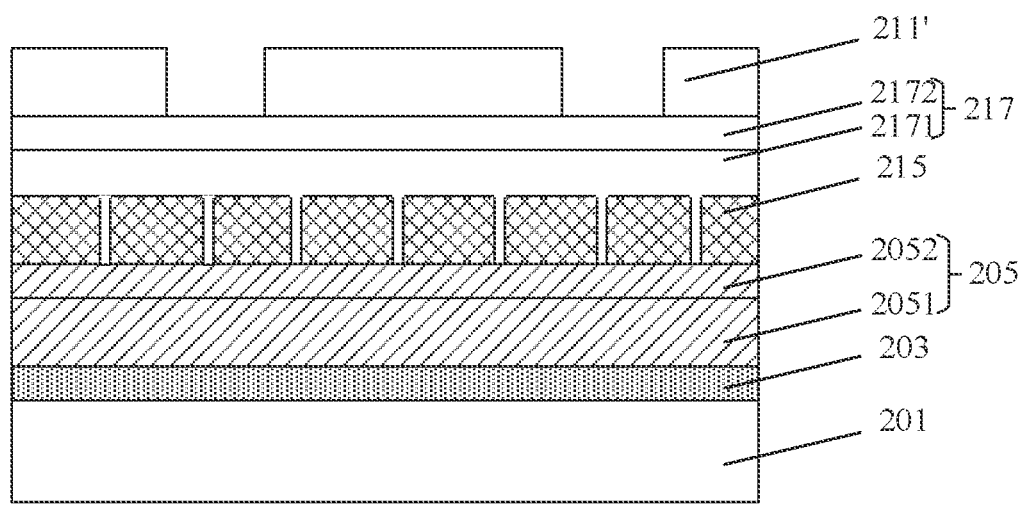
Figure 2L:
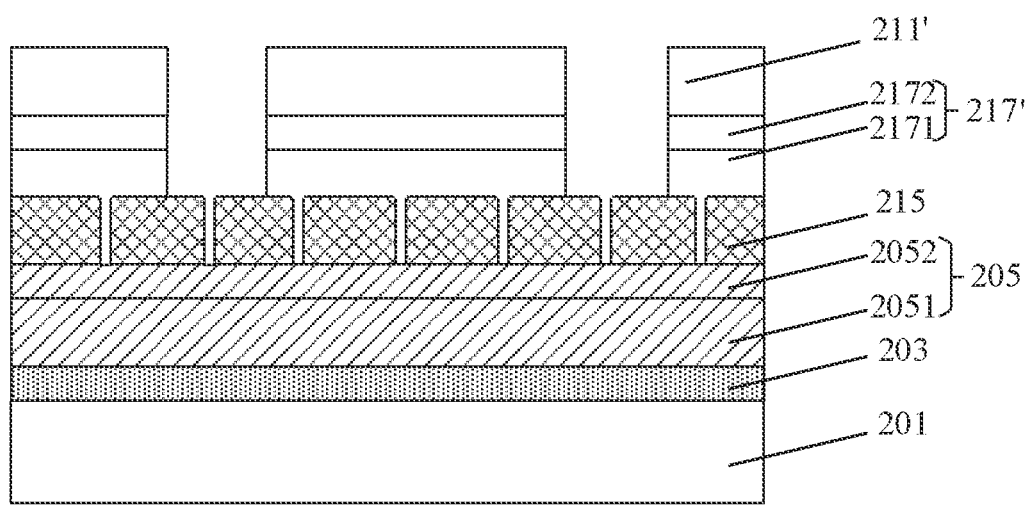
Figure 2M:
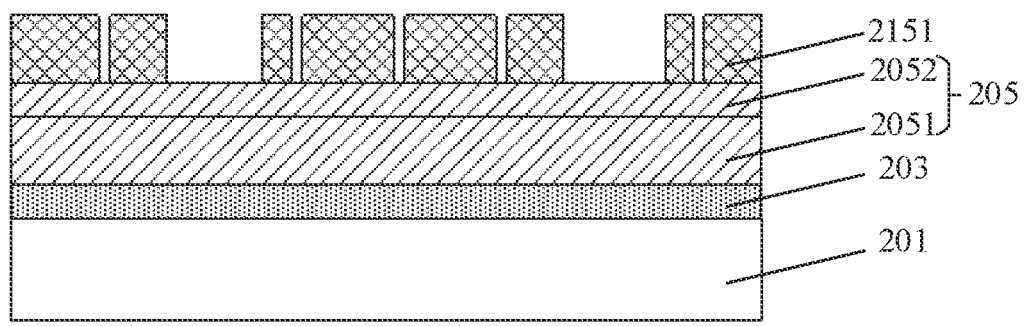

In some embodiments, as shown in FIG. 2K to 2M, after removing the spacers 2131, the method further comprises: forming a second mask layer 217 on the filling layer 215; etching the second mask layer 217 to form a second pattern, the second pattern exposing parts of the filling layer 215; patterning the filling layer 215 with the second mask layer as a mask to form a filling layer mask 2151. In practice, because of the precision and complex of the pattern, the process of one-step etching is difficult, and the process maintenance is difficult or even impossible to achieve. In this way, the filling layer is trimmed to form a final mask, which can effectively simplify the process and improve the yield.

Specifically, firstly, referring to FIG. 2K, the second mask layer 217 is formed on the filling layer 215. Here, the second mask layer 217 may comprise a lower second mask layer 2171 and an upper second mask layer 2172 which are stacked, and the upper second mask layer 2172 is located on the lower second mask layer 2171. The material of the upper second mask layer 2172 may include, but is not limited to, silicon oxynitride (SiON), polysilicon (Poly), amorphous carbon layer (ACL), oxide, and the like. The upper second mask layer 2172 may be formed by chemical vapor deposition (CVD) or spin-on dielectrics (SOD).

The material of the lower second mask layer 2171 may include, but is not limited to, a spin-on hard mask (SOH) layer, the SOH layer may be formed by spin coating, and may be an insulating layer of a hydrocarbon system, which may include a silicon hard mask material, a carbon hard mask material, an organic hard mask material, and the like.

Subsequently, referring to FIG. 2L, the second mask layer 217 is etched to form a second pattern, and the second pattern exposes parts of the filling layer 215. In some embodiments, etching the second mask layer 217 to form a second pattern comprises: forming a photoresist (PR) layer on the second mask layer 217; patterning the photoresist layer to form a second patterned photoresist layer 217', in which the first patterned photoresist layer 211' exposes the second mask layer 217. In some embodiments, the photoresist layer further includes a Si-containing anti-reflection coating (SiARC) that covers the surface of the second mask layer 217. In this way, the reflected light of lithography can be absorbed, thereby improving the linewidth resolution in lithography process. The process for etching the second mask layer 217 to form the second pattern is not limited thereto. In other embodiments, the second mask layer 217 may also be etched by self-aligned double patterning (SADP) process or self-aligned quadruple patterning (SAQP) process on the surface of the second mask layer 217 to form the second pattern.

Finally, referring to FIG. 2M, the filling layer 215 is patterned with the second mask layer 217 as a mask to form the filling layer mask 2151. Here, the filling layer 215 may be patterned by dry etching that includes sputtering and ion beam milling, plasma etching, high pressure plasma etching, high density plasma (HDP) etching, reactive ion etching (RIE) and the like. Dry etching has a high selection ratio, good controllability, flexibility and repeatability, and safe operation of fine lines, which can ensure the high fidelity of fine patterns after transfer.

Figure 2N:
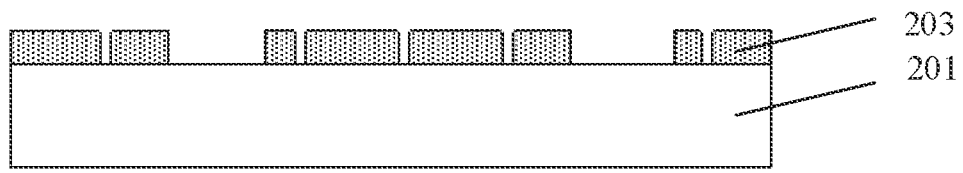

In some embodiments, as shown in FIG. 2N, after forming the filling layer mask 2151, the method further comprises: patterning the bottom mask layer 205 with the filling layer mask 2151 as a mask to form a third pattern, in which the third pattern exposes parts of the etching target layer 203; patterning the etching target layer 203 with the bottom mask layer 205 as a mask. Here, the bottom mask layer not only participates in pattern transfer, but also serves as an etching barrier layer to protect the etching target layer and avoid the etching target layer from being damaged by the subsequent process of forming the filling layer mask.

In one embodiment, patterning the bottom mask layer 205 with the filling layer mask 2151 as a mask includes: patterning the bottom mask layer by dry etching. In some embodiments, dry etching may have etching rates with different speeds, which is first fast and then slow down. This enables a more uniform depth when the desired pattern is subsequently transferred to the bottom mask layer 205.

In some embodiments, the etching rate, which is first fast and then slow down, may be achieved by adjusting the pressure of the cavity and/or radio frequency (RF) power of the dry etching device. Generally, with the increase of cavity pressure, the etching rate increases. Increasing RF power can increase the density of active agent and ions in plasma, thereby increasing the etching rate. In other embodiments, the etching rate, which is first fast and then slow down, may be achieved by adjusting the composition of the etching gas and/or the gas flow rate. For example, the etching rate can be controlled by adjusting the proportion of composition in the mixed gas. On the other hand, the gas flow rate determines the degree of the effective supply of reactant. If gas flow rate is too low, the etching rate is limited by the supplement of reactant gas, which will reduce the etching rate. If the gas flow rate is too high, it will lead to the loss of reactant gas in transit, which will also reduce the etching rate. In other embodiments, an etching rate which is first fast and then slows down may be achieved by adjusting the etching temperature. The etching temperature includes the temperature of the substrate and the temperature of the cavity, and the influence of the temperature is mainly reflected by the chemical reaction rate.

In other embodiments, the bottom mask layer comprises a first bottom mask layer and a second bottom mask layer, and the second bottom mask layer is located on the first bottom mask layer, and the second bottom mask layer has an etching rate greater than the etching rate of the first bottom mask layer. In some other embodiments, the bottom mask layer may include a stack of multiple layers of material with etching rates of each layer gradually decreasing in a top-down direction, thereby achieving the etching rate which is first fast and then slow down using different etching rates of different materials.

Figure 3:
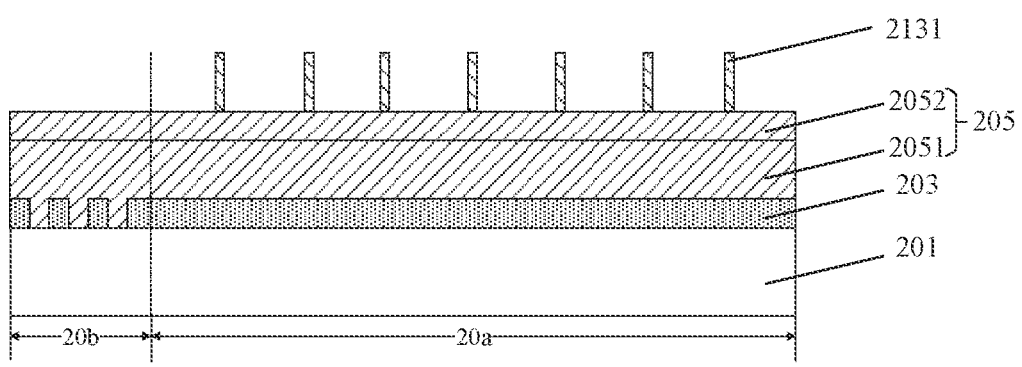
FIG. 3 illustrates a device structural diagram of a semiconductor structure provided by another embodiment of the present disclosure.

In some embodiments, as shown in FIG. 3 the etching target layer 203 includes an array unit area 20b and a peripheral unit area 20a located on the periphery of the array unit area 20b. The spacers 2131 are located on the peripheral unit area 20a. Dynamic random access memory (DRAM) includes an array memory cell array and a peripheral circuit. The memory cell array and the peripheral circuit may be integrated on the same chip, which allows for a wider bus and higher operating speeds. In practical applications, the memory cell array and the peripheral circuit may be formed in different areas of the same plane. Because the array unit area and the peripheral unit area have different device densities, and are not suitable for one-step formation. Patterning the metal layers separately can effectively improve the yield. At this time, the bottom mask layer 205 can be used to protect the device in the array unit area 20b, and avoid the contamination of process of patterning the etching target layer in the peripheral unit area 20a. Referring to FIG. 3, the etching target layer 203 in the array unit area 20b is patterned individually firstly and the device in the array unit area 20b is protected by the bottom mask layer 205. Then, for the etching target layer 203 in the peripheral unit area 20a, the method of forming spacers with vertical sidewall morphology, then depositing a filling layer and removing the spacers to form recesses is adopted to form a mask with a corresponding pattern for etching the etching target layer 203 in the peripheral unit area 20a. In this way, the process difficulty can be effectively reduced, the complexity of the pattern is reduced, and the yield is improved. It should be understood that, the sequence of separately patterning the etching target layer 203 in the array unit area 20b and the etching target layer 203 in the peripheral unit area 20a described above can be executed in reverse order without conflict.

Embodiments of the present disclosure also provide a semiconductor structure prepared by anyone of the above methods.

In summary, embodiments of the present disclosure provide a preparation method for a semiconductor structure and a semiconductor structure. Herein, the preparation method comprises: providing a structure to be processed, in which the structure to be processed comprises a substrate, and an etching target layer, a bottom mask layer and a first mask layer stacked on the substrate; patterning the first mask layer to form a first pattern, the first pattern exposing parts of the bottom mask layer; forming spacers with vertical sidewall morphology on sidewalls of the first mask layer; removing the first mask layer; filling a gap between the spacers with a filling layer, in which a material of the spacers to a material of the filling layer has a high etching selectivity ratio; removing the spacers. The embodiments of the present disclosure adopts a method of forming spacers with vertical sidewall morphology firstly, then depositing a filling layer and removing the spacers to form recesses, to form a mask with a corresponding pattern, and a high etching selectivity ratio of the spacers to the filling layer can improve the consistency of pattern transfer and the fineness of forming a patterned structure.

It should be noted that the preparation method for a semiconductor structure and the semiconductor structure provided by the embodiments of the present disclosure may be applied to any integrated circuit including this structure.

Any technical feature of the technical solution described in each embodiment can be arbitrarily combined without conflict. Those skilled in the art can change the operation sequence of the formation method without leaving the protection scope of the present disclosure. Under the condition that each operation of the embodiments of the present disclosure does not conflict, part of the operations may be executed at the same time or may be executed in reverse order.

The descriptions above are only preferred embodiments of the present disclosure, and are not intended to limit the scope of protection of the present disclosure. Any modification, equivalent replacement and improvement made within the spirit and principles of the present disclosure all fall with the protection scope of the present disclosure.

INDUSTRIAL APPLICABILITY

The embodiments of the present disclosure adopt a method of forming spacers with vertical sidewall morphology firstly, then depositing a filling layer and removing the spacers to form recesses, to form a mask with a corresponding pattern and a high etching selectivity ratio of the spacers to the filling layer can improve the consistency of pattern transfer and the fineness of forming a patterned structure.

The invention claimed is:

1. A preparation method for a semiconductor structure, comprising:
   providing a structure to be processed, wherein the structure to be processed comprises a substrate, and an etching target layer, a bottom mask layer and a first mask layer stacked on the substrate;
   patterning the first mask layer to form a first pattern, the first pattern exposing parts of the bottom mask layer;
   forming spacers with vertical sidewall morphology on sidewalls of the first mask layer;
   removing the first mask layer;
   forming a filling layer on the bottom mask layer, the filling layer filling a gap between two adjacent ones of the spacers and covering the spacers;
   planarizing the filling layer such that an upper surface of the filling layer is flush with upper surfaces of the spacers,
   wherein there is a high etching selectivity ratio of a material of the spacers to a material of the filling layer;
   removing the spacers;
   forming a second mask layer on the filling layer;
   etching the second mask layer to form a second pattern, the second pattern exposing parts of the filling layer; and
   patterning the filling layer with the second mask layer as a mask to form a filling layer mask.

2. The preparation method according to claim 1, wherein, after forming the filling layer mask, the method further comprises:
   patterning the bottom mask layer with the filling layer mask as a mask to form a third pattern, the third pattern exposing parts of the etching target layer; and
   patterning the etching target layer with the bottom mask layer as a mask.

3. The preparation method according to claim 1, wherein, the etching selectivity ratio of the material of the spacers to the material of the filling layer is greater than or equal to 100.

4. The preparation method according to claim 1, wherein, the material of the spacers has a Young's modulus greater than or equal to 25 GPa.

5. The preparation method according to claim 1, wherein, the material of the filling layers comprises oxide.

6. The preparation method according to claim 1, wherein, the material of the spacers comprises polysilicon, silicon nitride or metal oxide.

7. The preparation method according to claim 1, wherein, forming spacers with vertical sidewall morphology on sidewalls of the first mask layer comprises:
   forming a spacer layer covering the first mask layer and a surface of the bottom mask layer; and
   removing the spacer layer covering a top of the first mask layer and the spacer layer covering the surface of the bottom mask layer, and retaining the spacer layer on the sidewalls of the first mask layer to form the spacers with vertical sidewall morphology.

8. The preparation method according to claim 1, wherein, removing the spacers comprises:
   removing the spacers by an etching process with gas, wherein the gas comprises chlorine and hydrogen bromide.

9. The preparation method according to claim 1, wherein, removing the first mask layer comprises:
   removing the first mask layer by an ashing process.

10. The preparation method according to claim 1, wherein, patterning the first mask layer comprises:
    depositing a third mask layer on the first mask layer;
    patterning the third mask layer and the first mask layer; and
    removing the third mask layer and retaining the first mask layer.

11. The preparation method according to claim 10, wherein, patterning the third mask layer and the first mask layer comprises:
    forming a photoresist layer on the third mask layer;
    patterning the photoresist layer to form a first patterned photoresist layer, the first patterned photoresist layer exposing the third mask layer; and
    etching the third mask layer and the first mask layer with the first patterned photoresist layer as a mask.

12. The preparation method according to claim 1, wherein,
    the bottom mask layer comprises a first bottom mask layer and a second bottom mask layer, and the second bottom mask layer is located on the first bottom mask layer.

13. A semiconductor structure prepared by the preparation method for a semiconductor structure according to claim 1.

14. A semiconductor structure prepared by the preparation method for a semiconductor structure according to claim 2.

15. A semiconductor structure prepared by the preparation method for a semiconductor structure according to claim 3.

16. A semiconductor structure prepared by the preparation method for a semiconductor structure according to claim 4.

17. A semiconductor structure prepared by the preparation method for a semiconductor structure according to claim 12.

* * * * *